US012604475B2

(12) United States Patent
Wang et al.

(10) Patent No.: US 12,604,475 B2
(45) Date of Patent: Apr. 14, 2026

(54) MEMORY STRUCTURE AND MANUFACTURING METHOD THEREOF

(71) Applicant: United Microelectronics Corp., Hsinchu (TW)

(72) Inventors: Chia-Wen Wang, Tainan City (TW); Chien-Hung Chen, Hsinchu City (TW); Chia-Hui Huang, Tainan City (TW); Ling Hsiu Chou, Tainan City (TW); Jen Yang Hsueh, Tainan City (TW); Chih-Yang Hsu, Tainan City (TW)

(73) Assignee: United Microelectronics Corp., Hsinchu (TW)

( * ) Notice: Subject to any disclaimer, the term of this patent is extended or adjusted under 35 U.S.C. 154(b) by 614 days.

(21) Appl. No.: 17/990,738

(22) Filed: Nov. 21, 2022

(65) Prior Publication Data

US 2024/0114688 A1 Apr. 4, 2024

(30) Foreign Application Priority Data

Sep. 29, 2022 (CN) .......................... 202211202139.5

(51) Int. Cl.
| | |
|---|---|
| *H10B 43/30* | (2023.01) |
| *H10B 41/30* | (2023.01) |
| *H10D 64/01* | (2025.01) |

(52) U.S. Cl.
CPC ............. *H10B 43/30* (2023.02); *H10B 41/30* (2023.02); *H10D 64/037* (2025.01)

(58) Field of Classification Search
None
See application file for complete search history.

(56) References Cited

U.S. PATENT DOCUMENTS

| | | | | |
|---|---|---|---|---|
| 2009/0045453 A1* | 2/2009 | Heo | ....................... | H10B 69/00 |
| | | | | 257/E21.679 |
| 2010/0074029 A1* | 3/2010 | Katayama | .......... | G11C 16/0483 |
| | | | | 257/326 |
| 2014/0374814 A1* | 12/2014 | Wu | ........................ | H10B 43/40 |
| | | | | 257/326 |
| 2015/0333130 A1* | 11/2015 | Chen | .................... | H10D 64/035 |
| | | | | 438/591 |
| 2018/0182900 A1* | 6/2018 | Feng | .................... | H10D 84/038 |

* cited by examiner

*Primary Examiner* — Julio J Maldonado
*Assistant Examiner* — Pinaki Das
(74) *Attorney, Agent, or Firm* — JCIPRNET

(57) ABSTRACT

A memory structure including a substrate, a first doped region, a second doped region, a first gate, a second gate, a first charge storage structure, and a second charge storage structure is provided. The first gate is located on the first doped region. The second gate is located on the second doped region. The first charge storage structure is located between the first gate and the first doped region. The first charge storage structure includes a first tunneling dielectric layer, a first dielectric layer, and a first charge storage layer. The second charge storage structure is located between the second gate and the second doped region. The second charge storage structure includes a second tunneling dielectric layer, a second dielectric layer, and a second charge storage layer. The thickness of the second tunneling dielectric layer is greater than the thickness of the first tunneling dielectric layer.

9 Claims, 11 Drawing Sheets

MEMORY STRUCTURE AND MANUFACTURING METHOD THEREOF

CROSS-REFERENCE TO RELATED APPLICATION

This application claims the priority benefit of China application serial no. 202211202139.5, filed on Sep. 29, 2022. The entirety of the above-mentioned patent application is hereby incorporated by reference herein and made a part of this specification.

BACKGROUND

Technical Field

The invention relates to a semiconductor structure and a manufacturing method thereof, and particularly relates to a memory structure and a manufacturing method thereof.

Description of Related Art

Currently, the digital memory and the analog memory coexist in some memory structures. In addition, in the above-mentioned memory structure, the tunneling dielectric layer in the memory cell for the digital memory and the tunneling dielectric layer in the memory cell for the analog memory are formed by the same process and have the same thickness. However, how to improve the operation speed of the digital memory and the data retention capability of the analog memory is the goal of continuous efforts.

SUMMARY

The invention provides a memory structure and a manufacturing method thereof, which can improve the operation speed of the digital memory and the data retention capability of the analog memory.

The invention provides a memory structure, which includes a substrate, a first doped region, a second doped region, a first gate, a second gate, a first charge storage structure, and a second charge storage structure. The first doped region is located in the substrate. The second doped region is located in the substrate. The first gate is located on the first doped region. The second gate is located on the second doped region. The first charge storage structure is located between the first gate and the first doped region. The first charge storage structure includes a first tunneling dielectric layer, a first dielectric layer, and a first charge storage layer. The first tunneling dielectric layer is located on the substrate. The first dielectric layer is located on the first tunneling dielectric layer. The first charge storage layer is located between the first dielectric layer and the first tunneling dielectric layer. The second charge storage structure is located between the second gate and the second doped region. The second charge storage structure includes a second tunneling dielectric layer, a second dielectric layer, and a second charge storage layer. The second tunneling dielectric layer is located on the substrate. The second dielectric layer is located on the second tunneling dielectric layer. The second charge storage layer is located between the second dielectric layer and the second tunneling dielectric layer. The thickness of the second tunneling dielectric layer is greater than the thickness of the first tunneling dielectric layer.

According to an embodiment of the invention, in the memory structure, the first doped region and the second doped region may be separated from each other.

According to an embodiment of the invention, in the memory structure, the ratio of the thickness of the second tunneling dielectric layer to the thickness of the first tunneling dielectric layer may be greater than 1 and less than or equal to 1.35.

According to an embodiment of the invention, in the memory structure, the top of the second tunneling dielectric layer may be higher than the top of the first tunneling dielectric layer.

According to an embodiment of the invention, the memory structure may further include an amorphous region. The amorphous region is located in the substrate above the second doped region. The amorphous region may be adjacent to the top surface of the substrate.

According to an embodiment of the invention, in the memory structure, the second tunneling dielectric layer may be in direct contact with the amorphous region.

According to an embodiment of the invention, in the memory structure, there may be a dopant in the amorphous region. The dopant may include a group IVA element.

According to an embodiment of the invention, in the memory structure, the dopant may include germanium (Ge).

According to an embodiment of the invention, the memory structure may further include a well region. The well region is located in the substrate. The first doped region and the second doped region may be located in the well region.

According to an embodiment of the invention, the memory structure may further include a third gate, a third dielectric layer, a fourth gate, and a fourth dielectric layer. The third gate is located on the substrate. The third gate may be adjacent to the first gate. The third dielectric layer is located between the third gate and the substrate. The fourth gate is located on the substrate. The fourth gate may be adjacent to the second gate. The fourth dielectric layer is located between the fourth gate and the substrate.

The invention provides a manufacturing method of a memory structure, which includes the following steps. A substrate is provided. A first doped region is formed in the substrate. A second doped region is formed in the substrate. A first gate is formed on the first doped region. A second gate is formed on the second doped region. A first charge storage structure is formed between the first gate and the first doped region. The first charge storage structure includes a first tunneling dielectric layer, a first dielectric layer, and a first charge storage layer. The first tunneling dielectric layer is located on the substrate. The first dielectric layer is located on the first tunneling dielectric layer. The first charge storage layer is located between the first dielectric layer and the first tunneling dielectric layer. A second charge storage structure is formed between the second gate and the second doped region. The second charge storage structure includes a second tunneling dielectric layer, a second dielectric layer, and a second charge storage layer. The second tunneling dielectric layer is located on the substrate. The second dielectric layer is located on the second tunneling dielectric layer. The second charge storage layer is located between the second dielectric layer and the second tunneling dielectric layer. The thickness of the second tunneling dielectric layer is greater than the thickness of the first tunneling dielectric layer.

According to an embodiment of the invention, in the manufacturing method of the memory structure, the method of forming the first doped region may include the following steps. A patterned photoresist layer is formed on the substrate. An ion implantation process is performed on the substrate by using the patterned photoresist layer as a mask to form the first doped region.

According to an embodiment of the invention, in the manufacturing method of the memory structure, the method of forming the second doped region may include the following steps. A patterned photoresist layer is formed on the substrate. An ion implantation process is performed on the substrate by using the patterned photoresist layer as a mask to form the second doped region.

According to an embodiment of the invention, the manufacturing method of the memory structure may further include the following step. An amorphous region is formed in the second doped region. The amorphous region may be adjacent to the top surface of the substrate.

According to an embodiment of the invention, in the manufacturing method of the memory structure, the method of forming the amorphous region may include performing an ion implantation process on the substrate.

According to an embodiment of the invention, in the manufacturing method of the memory structure, the dopant of the ion implantation process may include a group IVA element.

According to an embodiment of the invention, in the manufacturing method of the memory structure, the implant energy of the ion implantation process may be 10 keV (kiloelectronvolt) to 12 keV.

According to an embodiment of the invention, in the manufacturing method of the memory structure, the implant dose of the ion implantation process may be $1 \times 10^{13}$ atoms/cm$^2$ to $1 \times 10^{16}$ atoms/cm$^2$.

According to an embodiment of the invention, in the manufacturing method of the memory structure, the implant dose of the ion implantation process may be $5 \times 10^{13}$ atoms/cm$^2$ to $5 \times 10^{15}$ atoms/cm$^2$.

According to an embodiment of the invention, in the manufacturing method of the memory structure, the method of forming the first tunneling dielectric layer and the second tunneling dielectric layer may include the following steps. A thermal oxidation process is performed on the substrate to form a tunneling dielectric material layer. The thickness of the tunneling dielectric material layer located directly above the second doped region may be greater than the thickness of the tunneling dielectric material layer located directly above the first doped region. The tunneling dielectric material layer is patterned to form the first tunneling dielectric layer and the second tunneling dielectric layer.

Based on the above description, in the memory structure and the manufacturing method thereof according to the invention, the thickness of the second tunneling dielectric layer is greater than the thickness of the first tunneling dielectric layer. Since the first tunneling dielectric layer can have a smaller thickness, the operation speed (e.g., programming speed and/or erasing speed) of the digital memory can be improved when the memory cell having the first tunneling dielectric layer is applied to the digital memory. In addition, since the second tunneling dielectric layer can have a greater thickness, the data retention capability of the analog memory can be improved when the memory cell having the second tunneling dielectric layer is applied to the analog memory.

In order to make the aforementioned and other objects, features and advantages of the invention comprehensible, several exemplary embodiments accompanied with drawings are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The embodiments are described in detail below with reference to the accompanying drawings, but the embodiments are not intended to limit the scope of the invention. For the sake of easy understanding, the same components in the following description will be denoted by the same reference symbols. In addition, the drawings are for illustrative purposes only and are not drawn to the original dimensions. In fact, the dimensions of the various features may be arbitrarily increased or reduced for clarity of discussion.

FIG. 1A to FIG. 1J are cross-sectional views illustrating a manufacturing process of a memory structure according to some embodiments of the invention.

Figure 1A:
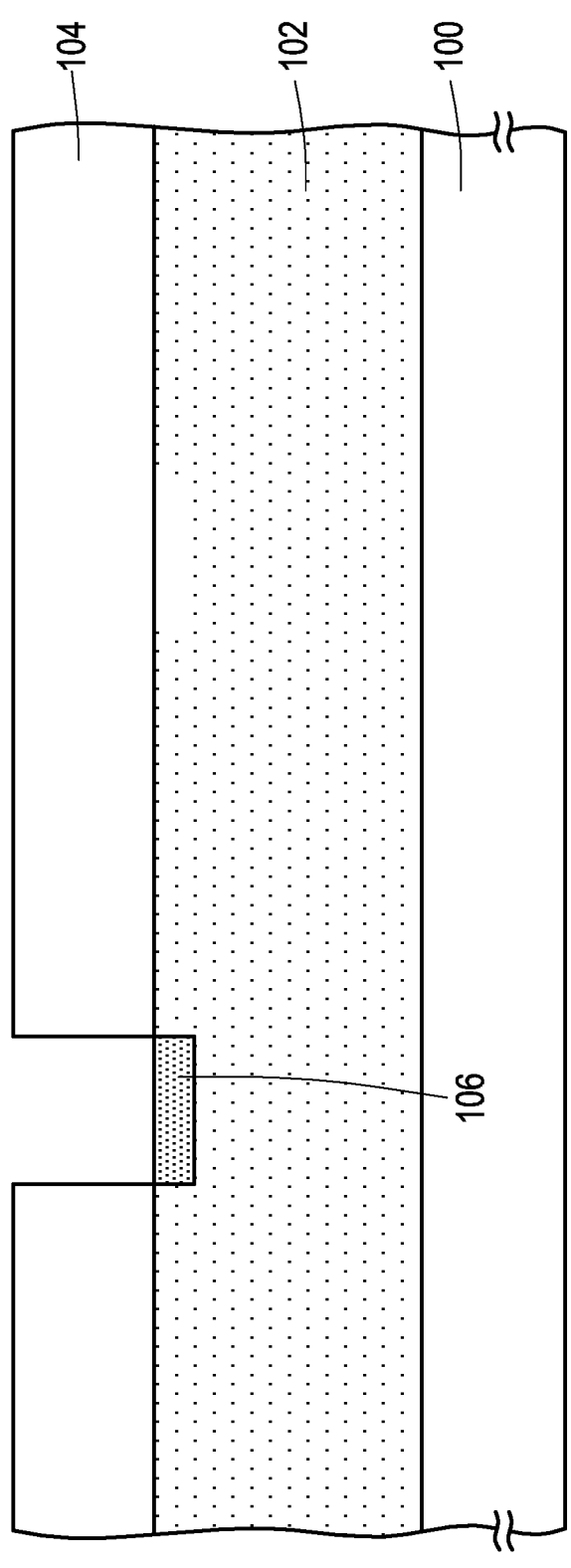
FIG. 1A to FIG. 1J are cross-sectional views illustrating a manufacturing process of a memory structure according to some embodiments of the invention.

Referring to FIG. 1A, a substrate 100 is provided. In some embodiments, the substrate 100 may be a semiconductor substrate such as a silicon substrate. Furthermore, a well region 102 may be formed in the substrate 100. In some embodiments, the well region 102 may have the first conductivity type (e.g., P-type). Hereinafter, the first conductivity type and the second conductivity type may be one and the other of a P-type conductivity type and an N-type conductivity type, respectively. In the present embodiment, the first conductivity type is, for example, a P-type conductivity type, and the second conductivity type is, for example, an N-type conductivity type, but the invention is not limited thereto. In other embodiments, the first conductivity type may be an N-type conductivity type, and the second conductivity type may be a P-type conductivity type. The method of forming the well region 102 is, for example, an ion implantation method.

A patterned photoresist layer 104 may be formed on the substrate 100. The patterned photoresist layer 104 may expose a portion of the substrate 100. In some embodiments, the patterned photoresist layer 104 may be formed by a lithography process.

An ion implantation process may be performed on the substrate 100 by using the patterned photoresist layer 104 as a mask to form the doped region 106. Therefore, the doped regions 106 may be formed in the substrate 100. In some embodiments, the doped region 106 may have the first conductivity type (e.g., P-type).

Figure 1B:
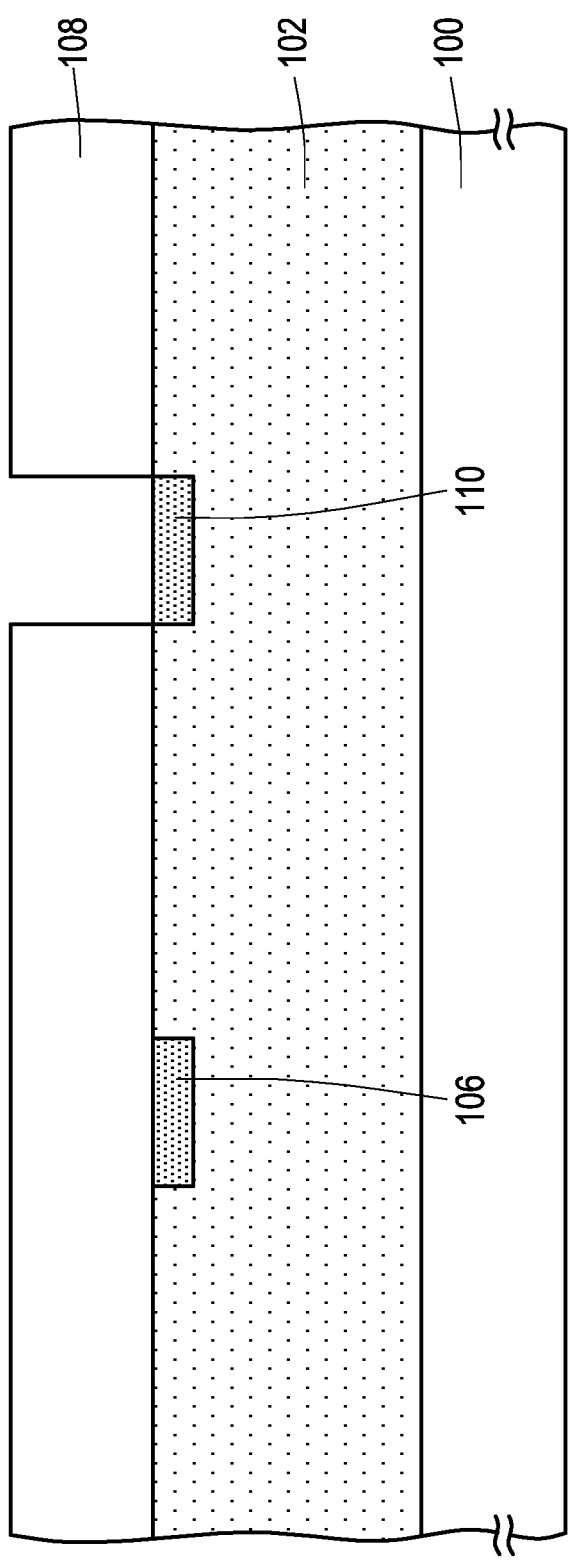

Referring to FIG. 1B, the patterned photoresist layer 104 may be removed. In some embodiments, the method of removing the patterned photoresist layer 104 is, for example, a dry stripping method or a wet stripping method.

A patterned photoresist layer 108 may be formed on the substrate 100. The patterned photoresist layer 108 may expose a portion of the substrate 100. In some embodiments, the patterned photoresist layer 108 may be formed by a lithography process.

An ion implantation process may be performed on the substrate 100 by using the patterned photoresist layer 108 as a mask to form the doped region 110. Therefore, the doped region 110 may be formed in the substrate 100. In some embodiments, the doped region 110 may have the first conductivity type (e.g., P-type).

Figure 1C:
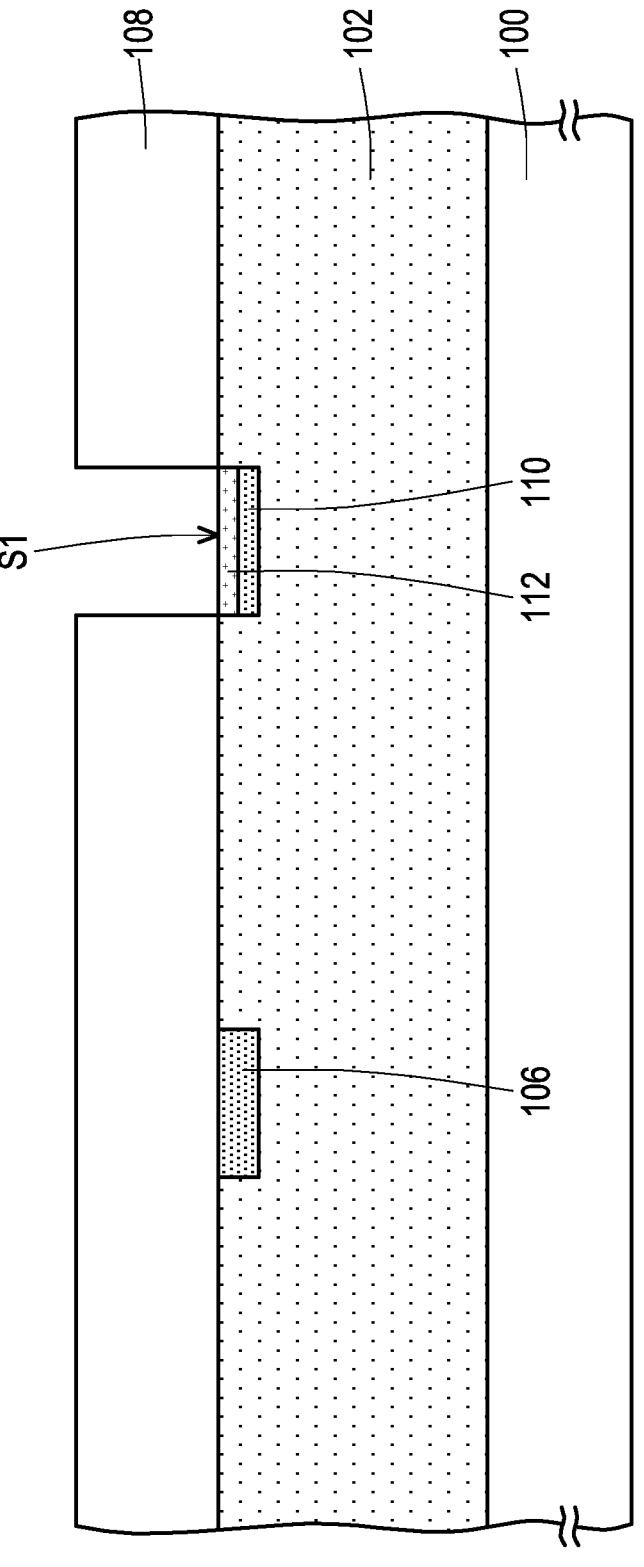

Referring to FIG. 1C, an amorphous region 112 may be formed in the doped region 110. The amorphous region 112 may be adjacent to the top surface S1 of the substrate 100. In some embodiments, the method of forming the amorphous region 112 may include performing an ion implantation process on the substrate 100. In some embodiments, an ion implantation process may be performed on the substrate 100 by using the patterned photoresist layer 108 as a mask to form the amorphous region 112 in the doped region 110. That is, the ion implantation process for forming the amorphous region 112 and the ion implantation process for forming the doped region 110 may use the same patterned photoresist layer (i.e., patterned photoresist layer 108) as a mask.

In some embodiments, the dopant of the ion implantation process used to form the amorphous region 112 may include a group IVA element. In some embodiments, the dopant of the ion implantation process used to form the amorphous region 112 may include carbon (C), silicon (Si), germanium (Ge), tin (Sn), lead (Pb), or flerovium (Fl). In some embodiments, the dopant of the ion implantation process used to form the amorphous region 112 may include germanium. In some embodiments, the implant energy of the ion implantation process used to form the amorphous region 112 may be 10 keV to 12 keV. In some embodiments, the implant dose of the ion implantation process used to form the amorphous region 112 may be $1 \times 10^{13}$ atoms/cm$^2$ to $1 \times 10^{16}$ atoms/cm$^2$. In some embodiments, the implant dose of the ion implantation process used to form the amorphous region 112 may be $5 \times 10^{13}$ atoms/cm$^2$ to $5 \times 10^{15}$ atoms/cm$^2$.

In the present embodiment, the doped region 106 may be formed first, and then the doped region 110 and the amorphous region 112 may be formed, but the invention is not limited thereto. In other embodiments, the doped region 110 and the amorphous region 112 may be formed first, and then the doped region 106 may be formed.

Figure 1D:
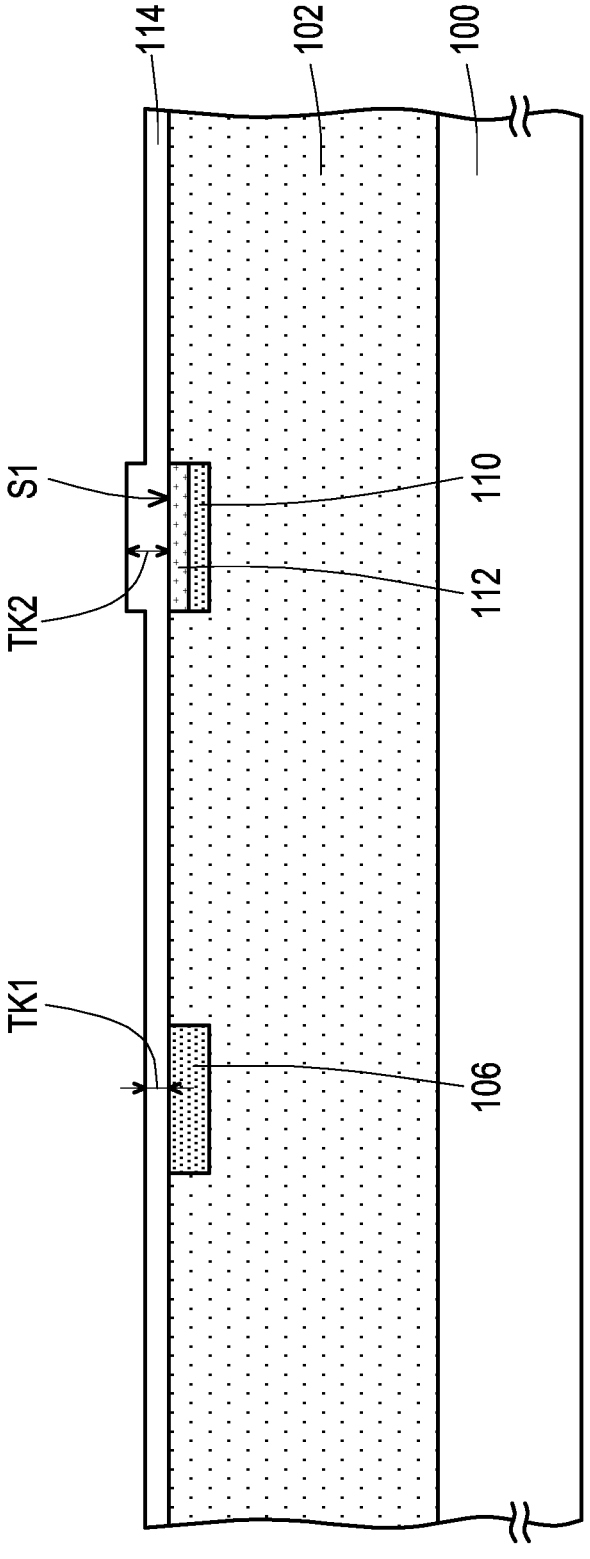

Referring to FIG. 1D, the patterned photoresist layer 108 may be removed. In some embodiments, the method of removing the patterned photoresist layer 108 is, for example, a dry stripping method or a wet stripping method.

A thermal oxidation process may be performed on the substrate 100 to form a tunneling dielectric material layer 114. In the thermal oxidation process, since the tunneling dielectric material layer 114 grows faster on the amorphous region 112, the thickness TK2 of the tunneling dielectric material layer 114 located directly above the doped region 110 may be greater than the thickness TK1 of the tunneling dielectric material layer 114 located directly above the doped region 106. In some embodiments, the thickness TK2 of the tunneling dielectric material layer 114 located directly above the doped region 110 may be adjusted by the type of the thermal oxidation process and the implant dose of the ion implantation process used to form the amorphous region 112. In some embodiments, the material of the tunneling dielectric material layer 114 is, for example, silicon oxide. In some embodiments, the thermal oxidation process is, for example, a dry oxidation process, an in situ steam generation (ISSG) process, or a rapid thermal oxidation (RTO) process.

Figure 1E:
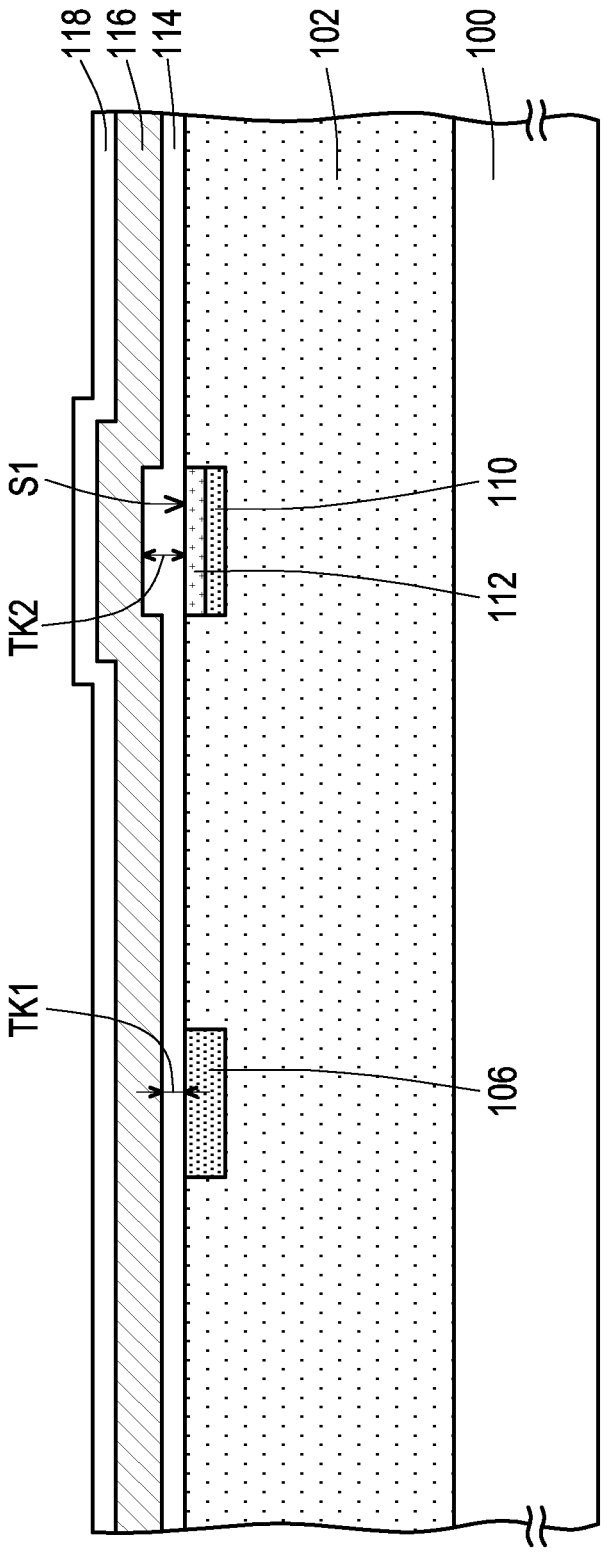

Referring to FIG. 1E, a charge storage material layer 116 may be formed on the tunneling dielectric material layer 114. In some embodiments, the material of the charge storage material layer 116 is, for example, a charge trapping material such as silicon nitride. In some embodiments, the method of forming the charge storage material layer 116 is, for example, a chemical vapor deposition (CVD) method.

A dielectric material layer 118 may be formed on the charge storage material layer 116. In some embodiments, the material of the dielectric material layer 118 is, for example, silicon oxide. In some embodiments, the method of forming the dielectric material layer 118 is, for example, a CVD method.

Figure 1F:
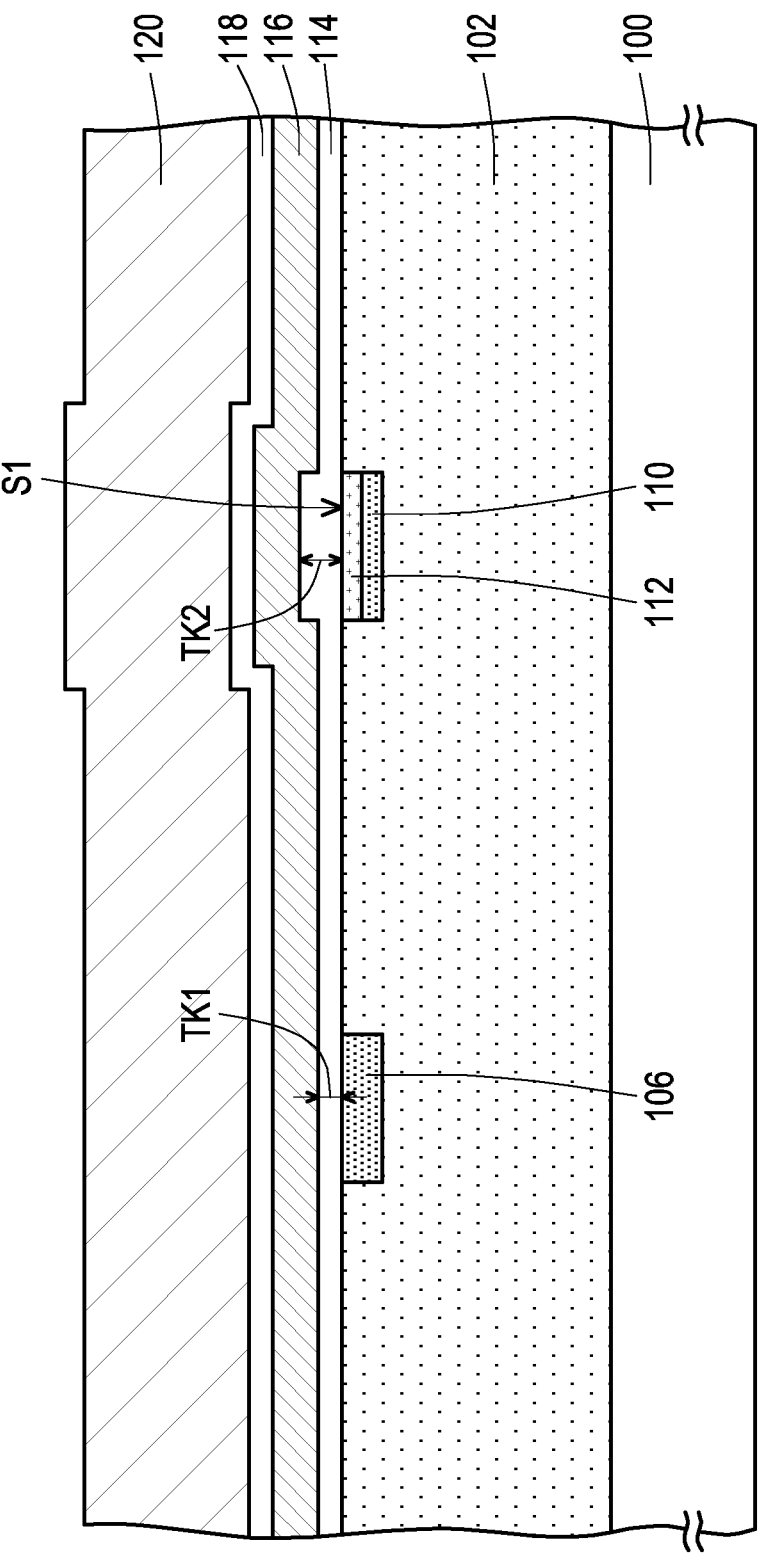

Referring to FIG. 1F, a gate material layer 120 may be formed on the dielectric material layer 118. In some embodiments, the material of the gate material layer 120 is, for example, doped polysilicon. In some embodiments, the method of forming the gate material layer 120 is, for example, a CVD method.

Figure 1G:
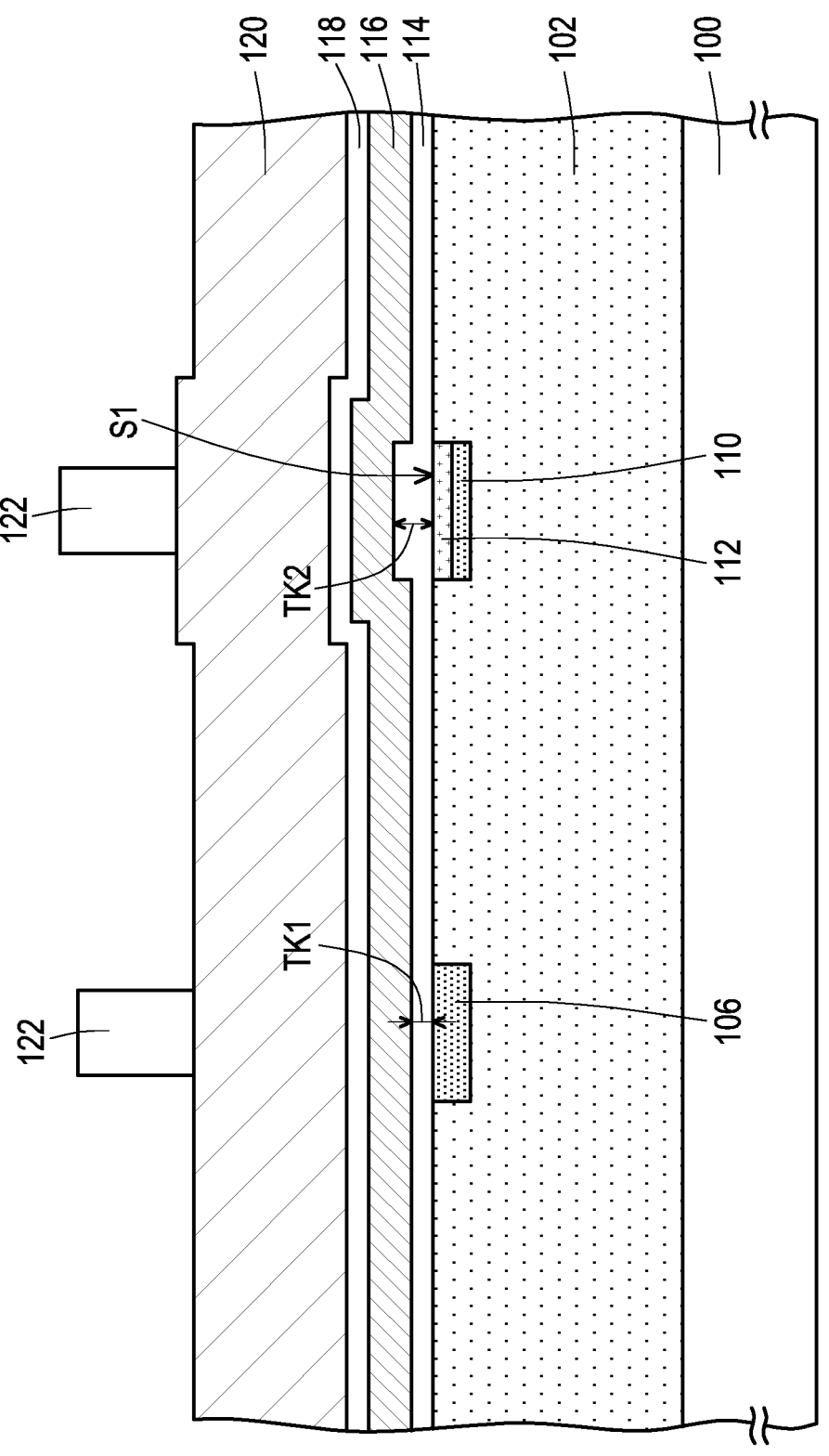

Referring to FIG. 1G, a patterned photoresist layer 122 may be formed on the gate material layer 120. The patterned photoresist layer 122 may expose a portion of the gate material layer 120. In some embodiments, the patterned photoresist layer 122 may be formed by a lithography process.

Figure 1H:
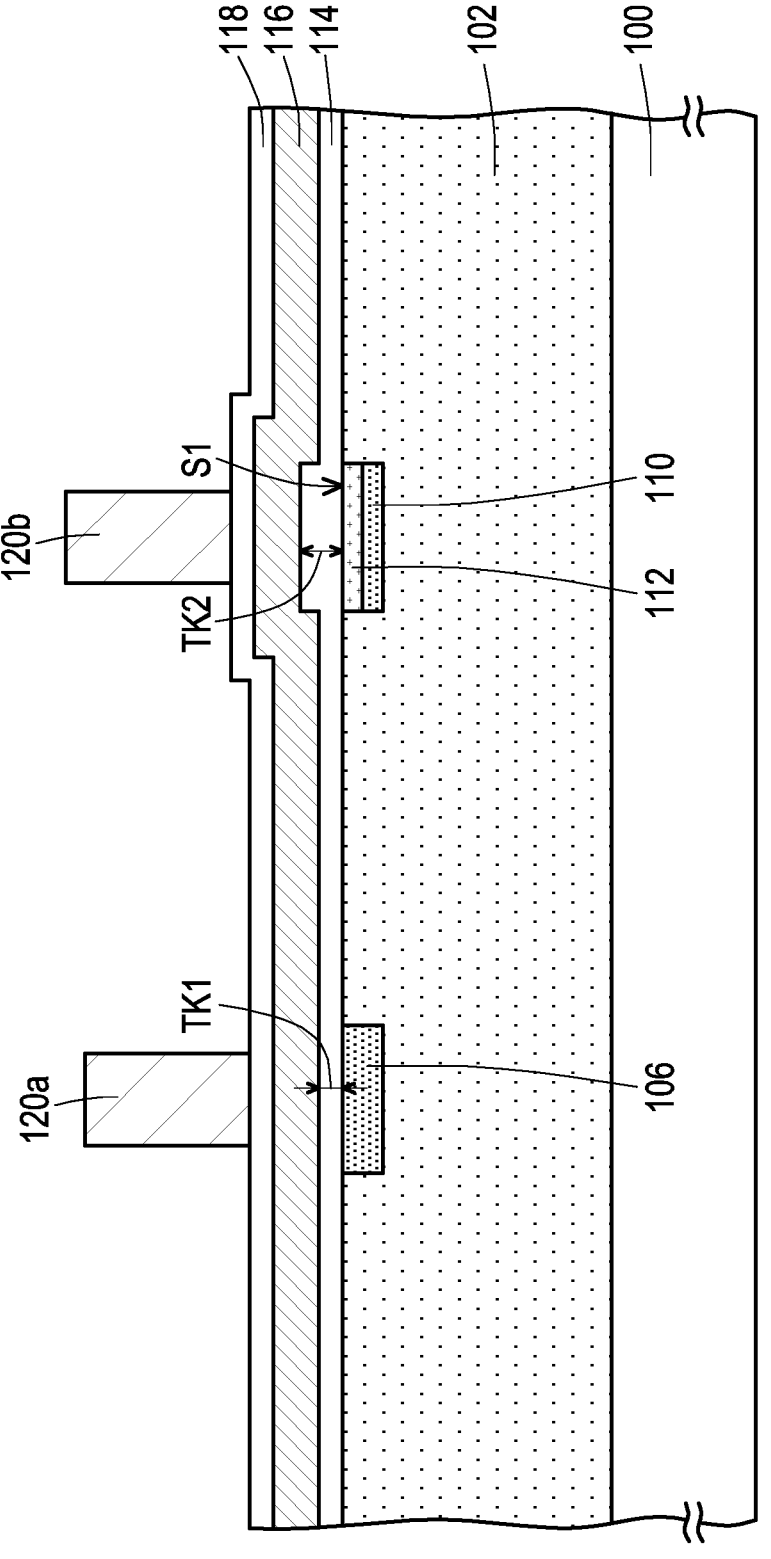

Referring to FIG. 1H, a portion of the gate material layer 120 may be removed by using the patterned photoresist layer 122 as a mask to form a gate 120a and a gate 120b. Therefore, the gate 120a may be formed on the doped region 106, and the gate 120b may be formed on the doped region 110. In some embodiments, the gate 120a and the gate 120b may be formed on the dielectric material layer 118. In some embodiments, the material of the gate 120a and the material of the gate 120b are, for example, doped polysilicon. In some embodiments, the method of removing the portion of the gate material layer 120 is, for example, a dry etching method.

The patterned photoresist layer 122 may be removed. In some embodiments, the method of removing the patterned photoresist layer 122 is, for example, a dry stripping method or a wet stripping method.

Figure 1I:
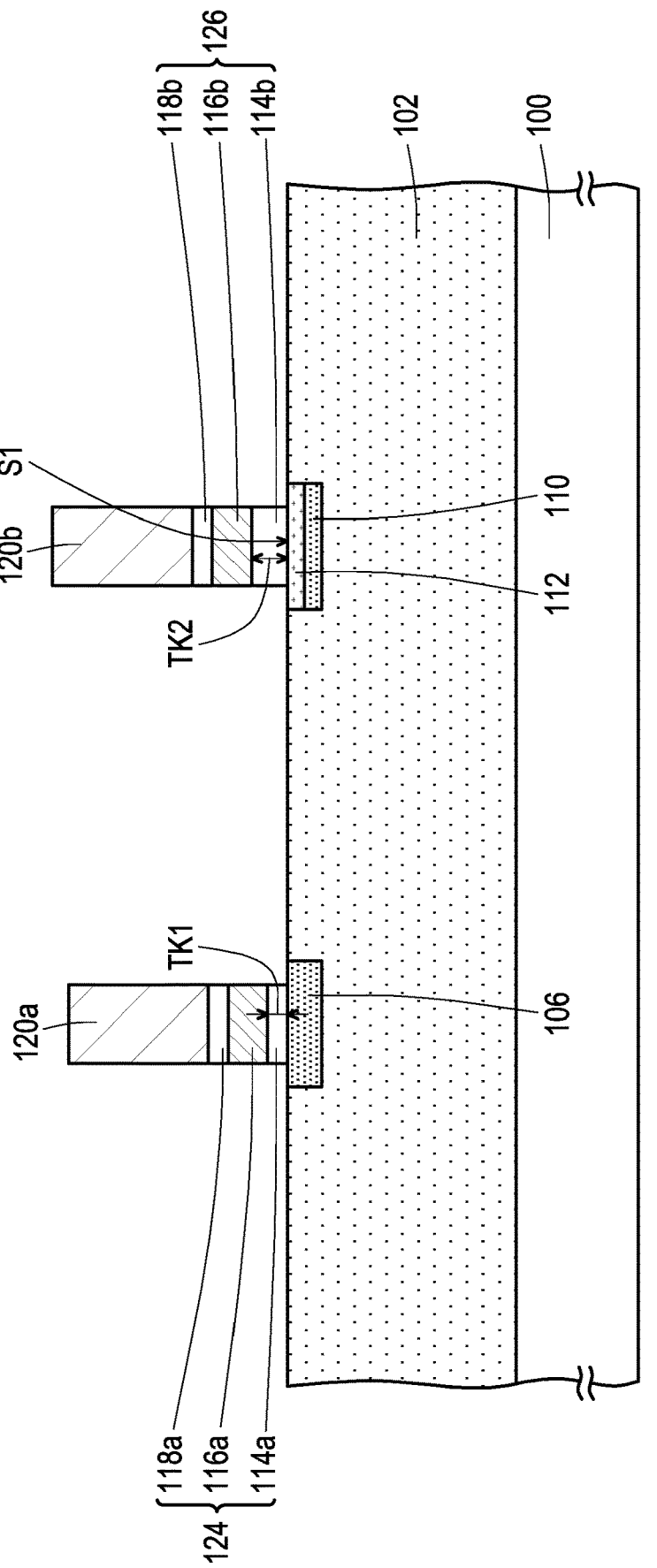

Referring to FIG. 1I, a portion of the dielectric material layer 118, a portion of the charge storage material layer 116, and a portion of the tunneling dielectric material layer 114 may be removed by using the gate 120a and the gate 120b as a mask. Therefore, the dielectric material layer 118, the charge storage material layer 116, and the tunneling dielectric material layer 114 may be patterned to form a dielectric layer 118a, a dielectric layer 118b, a charge storage layer 116a, a charge storage layer 116b, a tunneling dielectric layer 114a, and a tunneling dielectric layer 114b. In some embodiments, the material of the dielectric layer 118a and the material of the dielectric layer 118b are, for example, silicon oxide. In some embodiments, the material of the charge storage layer 116a and the material of the charge storage layer 116b are, for example, a charge trapping material such as silicon nitride. In some embodiments, the material of the tunneling dielectric layer 114a and the material of the tunneling dielectric layer 114b are, for example, silicon oxide. In some embodiments, the method of removing the portion of the dielectric material layer 118 is, for example, a dry etching method. In some embodiments, the method of removing the portion of the charge storage material layer 116 is, for example, a dry etching method. In some embodiments, the method of removing the portion of the tunneling dielectric material layer 114 is, for example, a dry etching method.

By the above method, a charge storage structure 124 may be formed between the gate 120*a* and the doped region 106, and a charge storage structure 126 may be formed between the gate 120*b* and the doped region 110. The charge storage structure 124 includes the tunneling dielectric layer 114*a*, the dielectric layer 118*a*, and the charge storage layer 116*a*. The tunneling dielectric layer 114*a* is located on the substrate 100. The dielectric layer 118*a* is located on the tunneling dielectric layer 114*a*. The charge storage layer 116*a* is located between the dielectric layer 118*a* and the tunneling dielectric layer 114*a*. The charge storage structure 126 includes the tunneling dielectric layer 114*b*, the dielectric layer 118*b*, and the charge storage layer 116*b*. The tunneling dielectric layer 114*b* is located on the substrate 100. The dielectric layer 118*b* is located on the tunneling dielectric layer 114*b*. The charge storage layer 116*b* is located between the dielectric layer 118*b* and the tunneling dielectric layer 114*b*. The thickness TK2 of the tunneling dielectric layer 114*b* is greater than the thickness TK1 of the tunneling dielectric layer 114*a*. In addition, in the above method for forming the tunneling dielectric layer 114*a* and the tunneling dielectric layer 114*b*, the tunneling dielectric layer 114*a* having a smaller thickness and the tunneling dielectric layer 114*b* having a greater thickness may be fabricated without adding an additional mask.

Figure 1J:
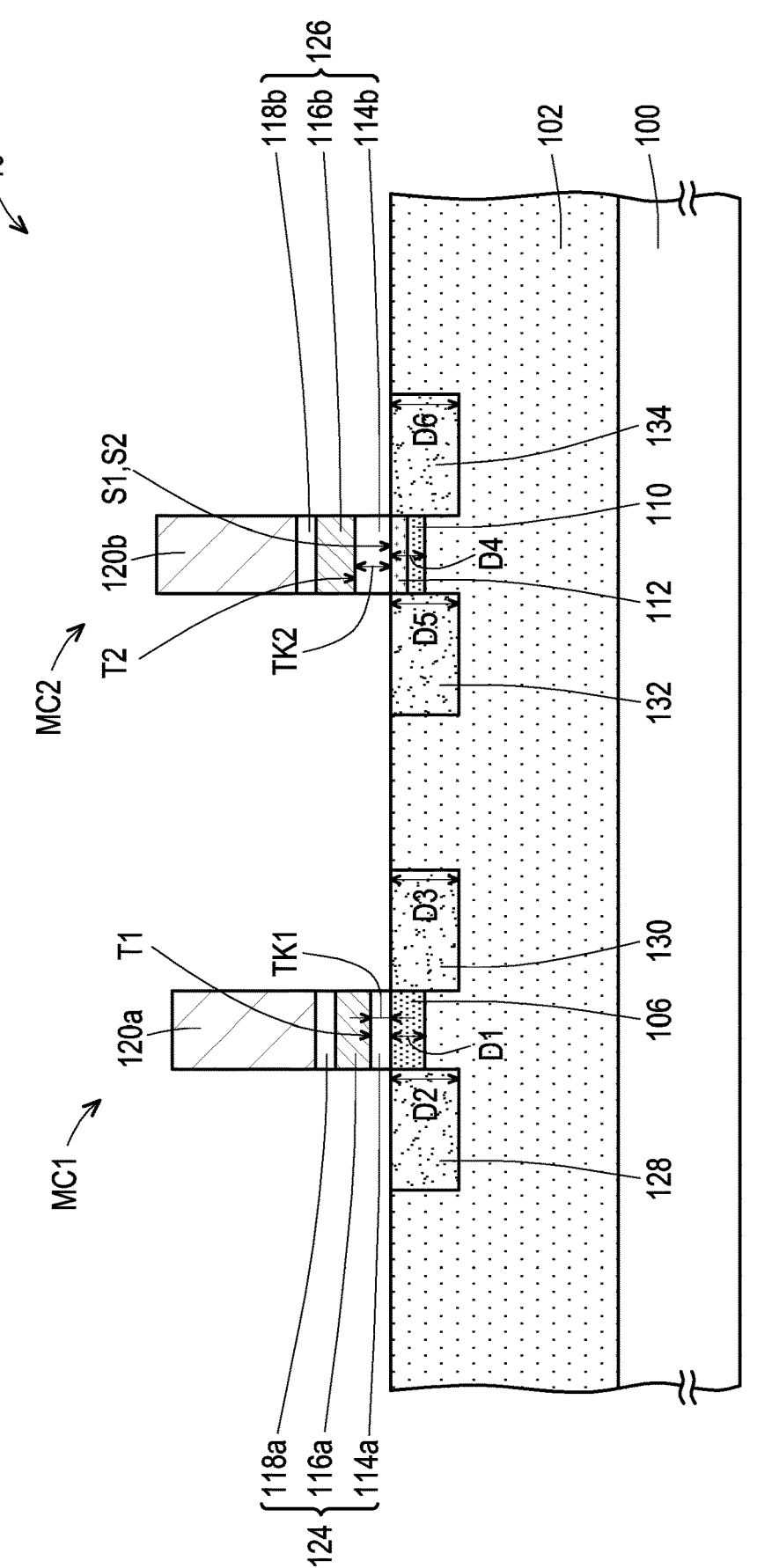

Referring to FIG. 1J, a doped region 128 and a doped region 130 may be formed in the substrate 100 on two sides of the gate 120*a*. In some embodiments, the doped region 128 and the doped region 130 may have the second conductivity type (e.g., N-type). In some embodiments, the method of forming the doped region 128 and the doped region 130 is, for example, an ion implantation method.

In addition, a doped region 132 and a doped region 134 may be formed in the substrate 100 on two sides of the gate 120*b*. In some embodiments, the doped region 132 and the doped region 134 may have the second conductivity type (e.g., N-type). In some embodiments, the method of forming the doped region 132 and the doped region 134 is, for example, an ion implantation method.

By the above method, a memory cell MC1 and a memory cell MC2 may be formed on the substrate 100. The memory cell MC1 may include the doped region 106, the gate 120*a*, the charge storage structure 124, the doped region 128, and the doped region 130. The memory cell MC2 may include the doped region 110, the amorphous region 112, the gate 120*b*, the charge storage structure 126, the doped region 132, and the doped region 134.

Hereinafter, the memory structure 10 of the above embodiment will be described with reference to FIG. 1J. In addition, although the method for forming the memory structure 10 is described by taking the above method as an example, the invention is not limited thereto.

Referring to FIG. 1J, the memory structure 10 includes a substrate 100, a doped region 106, a doped region 110, a gate 120*a*, a gate 120*b*, a charge storage structure 124, and a charge storage structure 126. The doped region 106 is located in the substrate 100. The doped region 106 may be used to adjust the threshold voltage (Vt) of the memory cell MC1. In some embodiments, the doped region 106 may have the first conductivity type (e.g., P-type). The doped region 110 is located in the substrate 100. The doped region 110 may be used to adjust the threshold voltage of the memory cell MC2. In some embodiments, the doped region 110 may have the first conductivity type (e.g., P-type). In some embodiments, the doped region 106 and the doped region 110 may be separated from each other.

The gate 120*a* is located on the doped region 106. The gate 120*a* may be used as a control gate. The gate 120*b* is located on the doped region 110. The gate 120*b* may be used as a control gate. The charge storage structure 124 is located between the gate 120*a* and the doped region 106. The charge storage structure 124 includes a tunneling dielectric layer 114*a*, a dielectric layer 118*a*, and a charge storage layer 116*a*. The tunneling dielectric layer 114*a* is located on the substrate 100. The dielectric layer 118*a* is located on the tunneling dielectric layer 114*a*. The charge storage layer 116*a* is located between the dielectric layer 118*a* and the tunneling dielectric layer 114*a*. The charge storage structure 126 is located between the gate 120*b* and the doped region 110. The charge storage structure 126 includes a tunneling dielectric layer 114*b*, a dielectric layer 118*b*, and a charge storage layer 116*b*. The tunneling dielectric layer 114*b* is located on the substrate 100. The dielectric layer 118*b* is located on the tunneling dielectric layer 114*b*. The charge storage layer 116*b* is located between the dielectric layer 118*b* and the tunneling dielectric layer 114*b*.

The thickness TK2 of the tunneling dielectric layer 114*b* is greater than the thickness TK1 of the tunneling dielectric layer 114*a*. In some embodiments, the ratio of the thickness TK2 of the tunneling dielectric layer 114*b* to the thickness TK1 of the tunneling dielectric layer 114*a* may be greater than 1 and less than or equal to 1.35. In some embodiments, the ratio of the thickness TK2 of the tunneling dielectric layer 114*b* to the thickness TK1 of the tunneling dielectric layer 114*a* may be greater than 1 and less than or equal to 1.2. In some embodiments, the top T2 of the tunneling dielectric layer 114*b* may be higher than the top T1 of the tunneling dielectric layer 114*a*.

The memory structure 10 may further include an amorphous region 112. The amorphous region 112 is located in the substrate 100 above the doped region 110. The amorphous region 112 may be adjacent to the top surface S1 of the substrate 100. In some embodiments, the top surface S2 of the amorphous region 112 may be a portion of the top surface S1 of the substrate 100. In some embodiments, the tunneling dielectric layer 114*b* may be in direct contact with the amorphous region 112.

In some embodiments, there may be a dopant in the amorphous region 112. In some embodiments, the dopant in the amorphous region 112 may include a group IVA element. In some embodiments, the dopant in the amorphous region 112 may include carbon (C), silicon (Si), germanium (Ge), tin (Sn), lead (Pb), or flerovium (Fl). In some embodiments, the dopant in amorphous region 112 may include germanium.

The memory structure 10 may further include a well region 102. The well region 102 is located in the substrate 100. The doped region 106 and the doped region 110 may be located in the well region 102. In some embodiments, the well region 102 may have the first conductivity type (e.g., P-type).

The memory structure 10 may further include a doped region 128, a doped region 130, a doped region 132, and a doped region 134. The doped region 128 and the doped region 130 are located in the substrate 100 at two sides of the gate 120*a*. The doped region 128 and the doped region 130 may be located in the well region 102. In some embodiments, the depth D2 of the doped region 128 and the depth D3 of the doped region 130 may be greater than the depth D1 of the doped region 106. In some embodiments, the doped region 128 and the doped region 130 may have the second conductivity type (e.g., N-type).

The doped region 132 and the doped region 134 are located in the substrate 100 at two sides of the gate 120b. The doped region 132 and the doped region 134 may be located in the well region 102. In some embodiments, the depth D5 of the doped region 132 and the depth D6 of the doped region 134 may be greater than the depth D4 of the doped region 110. In some embodiments, the doped region 132 and the doped region 134 may have the second conductivity type (e.g., N-type).

The memory structure 10 may include a memory cell MC1 and a memory cell MC2. In some embodiments, each of the memory cell MC1 and the memory cell MC2 may be a semiconductor-oxide-nitride-oxide-semiconductor (SONOS) memory cell. In some embodiments, the memory cell MC1 may be applied to the digital memory, and the memory cell MC2 may be applied to the analog memory. The memory cell MC1 may include the doped region 106, the gate 120a, the charge storage structure 124, the doped region 128, and the doped region 130. The memory cell MC2 may include the doped region 110, the amorphous region 112, the gate 120b, the charge storage structure 126, the doped region 132, and the doped region 134.

In addition, the details (e.g., the material and the forming method) of each component in the memory structure 10 have been described in detail in the above embodiments, and the description thereof is not repeated here.

Based on the above embodiments, in the memory structure 10 and the manufacturing method thereof, the thickness TK2 of the tunneling dielectric layer 114b is greater than the thickness TK1 of the tunneling dielectric layer 114a. Since the tunneling dielectric layer 114a can have a smaller thickness, the operation speed (e.g., programming speed and/or erasing speed) of the digital memory can be improved when the memory cell MC1 having the tunneling dielectric layer 114a is applied to the digital memory. In addition, since the tunneling dielectric layer 114b can have a greater thickness, the data retention capability of the analog memory can be improved when the memory cell MC2 having the tunneling dielectric layer 114b is applied to the analog memory.

Figure 2:
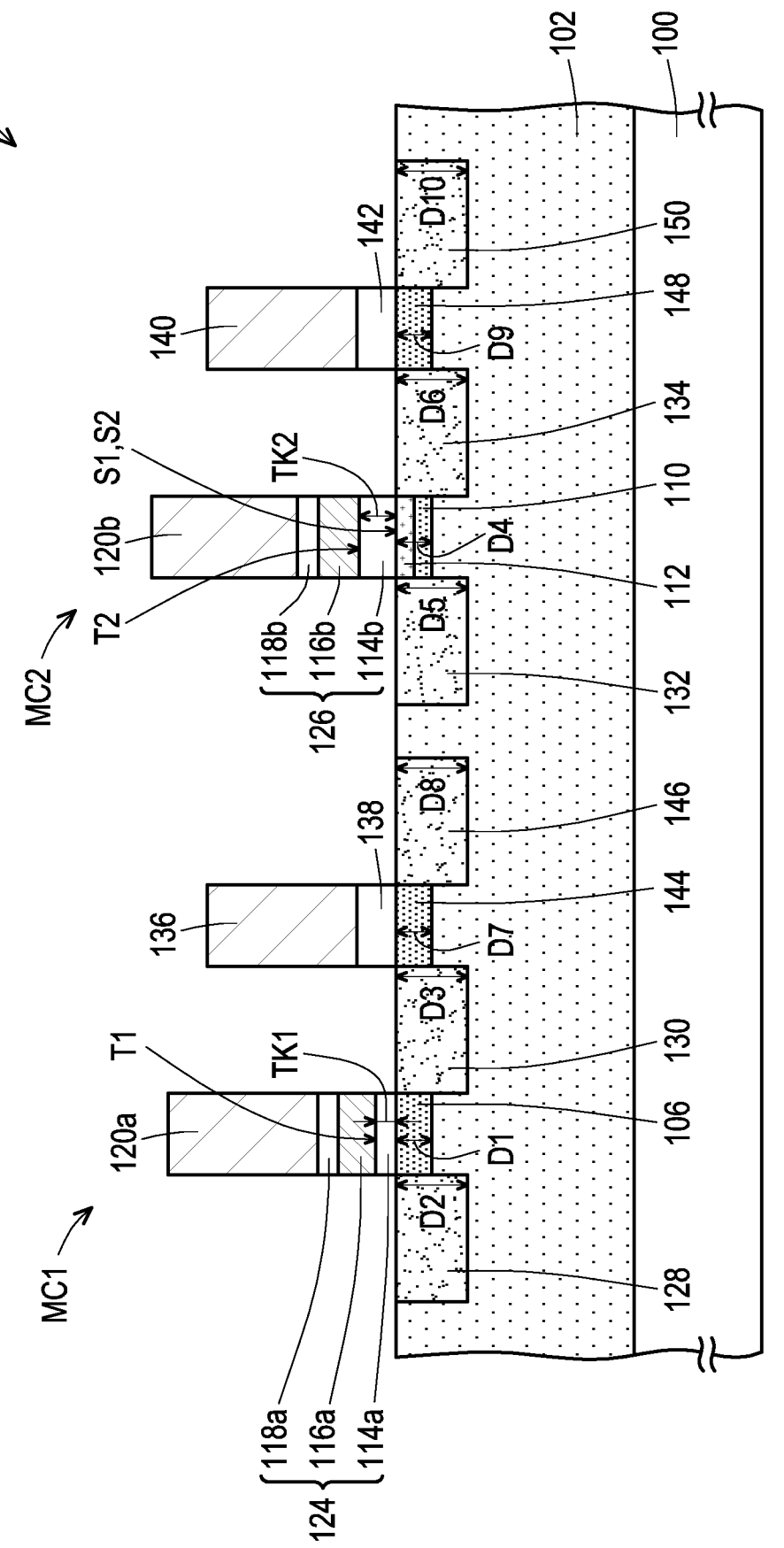
FIG. 2 is a cross-sectional view illustrating a memory structure according to other embodiments of the invention.

FIG. 2 is a cross-sectional view illustrating a memory structure according to other embodiments of the invention.

Referring to FIG. 1J and FIG. 2, the difference between a memory structure 20 of FIG. 2 and the memory structure 10 of FIG. 1J is as follows. The memory structure 20 may further include a gate 136, a dielectric layer 138, a gate 140, and a dielectric layer 142. The gate 136 is located on the substrate 100. The gate 136 may be adjacent to the gate 120a. The gate 136 may be used as a select gate. In some embodiments, the material of the gate 136 is, for example, doped polysilicon. The dielectric layer 138 is located between the gate 136 and the substrate 100. In some embodiments, the material of the dielectric layer 138 is, for example, silicon oxide.

The gate 140 is located on the substrate 100. The gate 140 may be adjacent to the gate 120b. The gate 140 may be used as a select gate. In some embodiments, the material of the gate 140 is, for example, doped polysilicon. The dielectric layer 142 is located between the gate 140 and the substrate 100. In some embodiments, the material of the dielectric layer 142 is, for example, silicon oxide.

The memory structure 20 may further include a doped region 144, a doped region 146, a doped region 148, and a doped region 150. The doped region 144 is located in the substrate 100 below the gate 136. The doped region 144 may be located in the well region 102. In some embodiments, the doped region 144 may have the first conductivity type (e.g., P-type). The doped region 146 is located in the substrate 100 at one side of the gate 136. The doped region 146 may be located in the well region 102. The doped region 146 may have the second conductivity type (e.g., N-type). In some embodiments, the depth D3 of the doped region 130 and the depth D8 of the doped region 146 may be greater than the depth D7 of the doped region 144.

The doped region 148 is located in the substrate 100 below the gate 140. The doped region 148 may be located in the well region 102. In some embodiments, the doped region 148 may have the first conductivity type (e.g., P-type). The doped region 150 is located in the substrate 100 at one side of the gate 140. The doped region 150 may be located in the well region 102. The doped region 150 may have the second conductivity type (e.g., N type). In some embodiments, the depth D6 of the doped region 134 and the depth D10 of the doped region 150 may be greater than the depth D9 of the doped region 148.

In addition, the same or similar components in the memory structure 20 and the memory structure 10 are denoted by the same reference symbols, and the description thereof is not repeated here.

Based on the above embodiments, in the memory structure 20, the thickness TK2 of the tunneling dielectric layer 114b is greater than the thickness TK1 of the tunneling dielectric layer 114a. Since the tunneling dielectric layer 114a can have a smaller thickness, the operation speed (e.g., programming speed and/or erasing speed) of the digital memory can be improved when the memory cell MC1 having the tunneling dielectric layer 114a is applied to the digital memory. In addition, since the tunneling dielectric layer 114b can have a greater thickness, the data retention capability of the analog memory can be improved when the memory cell MC2 having the tunneling dielectric layer 114b is applied to the analog memory.

In summary, in the memory structure and the manufacturing method thereof of the aforementioned embodiments, the memory structure includes a first tunneling dielectric layer and a second tunneling dielectric layer, and the thickness of the second tunneling dielectric layer is greater than the thickness of the first tunneling dielectric layer. Since the first tunneling dielectric layer can have a smaller thickness, the operation speed (e.g., programming speed and/or erasing speed) of the digital memory can be improved when the memory cell having the first tunneling dielectric layer is applied to the digital memory. In addition, since the second tunneling dielectric layer can have a greater thickness, the data retention capability of the analog memory can be improved when the memory cell having the second tunneling dielectric layer is applied to the analog memory.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A memory structure, comprising:
   a substrate;
   a first doped region located in the substrate;
   a second doped region located in the substrate;
   a first gate located on the first doped region;
   a second gate located on the second doped region;
   a first charge storage structure located between the first gate and the first doped region and comprising:

a first tunneling dielectric layer located on the substrate;

a first dielectric layer located on the first tunneling dielectric layer; and a first charge storage layer located between the first dielectric layer and the first tunneling dielectric layer;

a second charge storage structure located between the second gate and the second doped region and comprising:

a second tunneling dielectric layer located on the substrate;

a second dielectric layer located on the second tunneling dielectric layer; and a second charge storage layer located between the second dielectric layer and the second tunneling dielectric layer, wherein a thickness of the second tunneling dielectric layer is greater than a thickness of the first tunneling dielectric layer; and an amorphous region located in the substrate above the second doped region, wherein the amorphous region is adjacent to a top surface of the substrate.

2. The memory structure according to claim 1, wherein the first doped region and the second doped region are separated from each other.

3. The memory structure according to claim 1, wherein a ratio of the thickness of the second tunneling dielectric layer to the thickness of the first tunneling dielectric layer is greater than 1 and less than or equal to 1.35.

4. The memory structure according to claim 1, wherein a top of the second tunneling dielectric layer is higher than a top of the first tunneling dielectric layer.

5. The memory structure according to claim 1, wherein the second tunneling dielectric layer is in direct contact with the amorphous region.

6. The memory structure according to claim 1, wherein there is a dopant in the amorphous region, and the dopant comprises a group IVA element.

7. The memory structure according to claim 6, wherein the dopant comprises germanium.

8. The memory structure according to claim 1, further comprising:

a well region located in the substrate, wherein the first doped region and the second doped region are located in the well region.

9. The memory structure according to claim 1, further comprising:

a third gate located on the substrate, wherein the third gate is adjacent to the first gate;

a third dielectric layer located between the third gate and the substrate;

a fourth gate located on the substrate, wherein the fourth gate is adjacent to the second gate; and a fourth dielectric layer located between the fourth gate and the substrate.

\* \* \* \* \*